(12) United States Patent
Min (10) Patent No.: US 7,588,992 B2
(45) Date of Patent: Sep. 15, 2009

(54) INTEGRATED THIN-FILM CAPACITOR WITH ETCH-STOP LAYER, PROCESS OF MAKING SAME, AND PACKAGES CONTAINING SAME

(75) Inventor: Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 11/152,328

(22) Filed: Jun. 14, 2005

(65) Prior Publication Data

US 2006/0281278 A1 Dec. 14, 2006

(51) Int. Cl.
*H01L 21/461* (2006.01)
(52) U.S. Cl. ................. 438/397; 438/742; 257/E21.008
(58) Field of Classification Search ......... 438/393–399, 438/689, 735, 742; 257/E21.008
See application file for complete search history.

(56) References Cited

U.S. PATENT DOCUMENTS

| 5,256,597 | A | * | 10/1993 | Gambino | .................... 438/625 |
|---|---|---|---|---|---|
| 5,930,639 | A | * | 7/1999 | Schuele et al. | .............. 438/396 |
| 6,165,814 | A | * | 12/2000 | Wark et al. | ................... 438/108 |
| 6,568,073 | B1 | * | 5/2003 | Fukutomi et al. | ............. 29/846 |
| 6,670,237 | B1 | * | 12/2003 | Loh et al. | .................... 438/253 |
| 6,841,861 | B2 | * | 1/2005 | Brady | ........................ 257/678 |
| 2004/0110319 | A1 | * | 6/2004 | Fukutomi et al. | ........... 438/106 |
| 2005/0161833 | A1 | * | 7/2005 | Takeuchi et al. | ............ 257/775 |
| 2005/0230800 | A1 | * | 10/2005 | Do et al. | ..................... 257/686 |

\* cited by examiner

*Primary Examiner*—Douglas M Menz
*Assistant Examiner*—Matthew W Such (57) ABSTRACT

A thin-film capacitor assembly includes a first metal bottom electrode, a dielectric layer, a second metal etch-stop layer, and a subsequent metal top electrode. The first metal bottom electrode is in contact with the dielectric layer. The second metal etch-stop layer is in contact with the dielectric layer. The subsequent metal top electrode is in contact with the second metal etch-stop layer. Processing of the thin-film capacitor assembly includes totally removing a stiffener after assembling the first metal bottom electrode as a layer to the dielectric layer and the second metal etch-stop layer. The stiffener is removed from above and on the second metal etch-stop layer. The thin-film capacitor assembly is laminated to a mounting substrate.

20 Claims, 6 Drawing Sheets

INTEGRATED THIN-FILM CAPACITOR WITH ETCH-STOP LAYER, PROCESS OF MAKING SAME, AND PACKAGES CONTAINING SAME

TECHNICAL FIELD

Embodiments relate generally to integrated thin-film capacitor fabrication. More particularly, embodiments relate to integrated thin-film capacitor packages in connection with microelectronic devices.

TECHNICAL BACKGROUND

Many efforts have been taken to integrate thin film capacitors (TFCs) into integrated circuit (IC) packages to improve IC performance. The processing temperatures for the high-k ceramic of TFC makes it necessary to fabricate it separately from the fabrication of an organic substrate into which it is to be installed.

The handling of such a TFC is difficult because of the physical limitations thereof. For example, a high-k ceramic film of TFC can be placed upon a thick metal foil and the thick metal foil is half-etched to achieve a useful thickness. Half-etching, however, is difficult because of the challenge of removing significantly uniform amounts across the surface of the thick metal foil. Subsequent processing is therefore adversely affected by the half-etching process.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a thin-film capacitor (TFC) assembly that includes an etch-stop layer. Embodiments also relate to a TFC assembly that is part of a chip package. Embodiments also relate to processes of making TFC assemblies. Embodiments also relate to systems that incorporate TFC assemblies.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

Figure 1A:
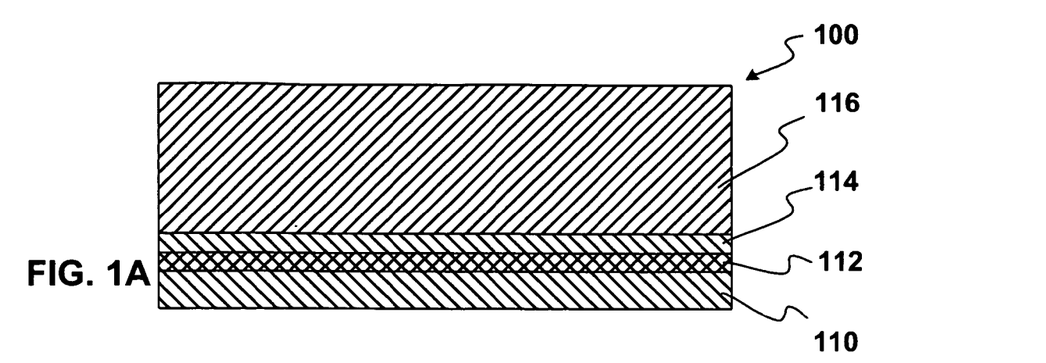
FIG. 1A is a cross-section elevation of a thin-film capacitor (TFC) assembly during processing according to an embodiment.

FIG. 1A is a cross-section elevation of a thin-film capacitor (TFC) assembly 100 during processing according to an embodiment. The TFC assembly 100 includes a first metal bottom electrode 110 layer that is disposed below a dielectric layer 112 according to an embodiment. The dielectric layer 112 is disposed below an etch-stop layer 114 according to an embodiment. The etch-stop layer 114 is disposed below a stiffener 116 according to an embodiment.

In an embodiment, the stiffener 116 is made of nickel foil and has a thickness in a range from about 50 micrometer (μm) to about 200 μm. In an embodiment, the stiffener 116 is made of copper foil and has a thickness range from about 50 micrometer μm to about 200 μm. In an embodiment, the stiffener 116 has a thickness of about 100 μm. In an embodiment, the stiffener 116 is made of tin.

The dielectric layer 112 can be organic or inorganic. In an embodiment, the dielectric layer 112 is a ceramic such as barium strontium titanate (BST). In an embodiment, the dielectric layer 112 is barium titanate (BT). In an embodiment, the dielectric layer 112 is strontium titanate (ST). Other ceramics can be used that have a dielectric constant similar to the titanate embodiments set forth above. Where the dielectric layer 112 is a ceramic, the TFC assembly 100 as depicted in FIG. 1A can be cured in a thermal environment such as an annealing furnace, with conventional atmospheric conditions, and in a temperature range from about 550° C. to about 850° C. In an embodiment, the dielectric layer 112 is BST that has been cured in a temperature range from about 600° C. to about 800° C. In an embodiment, the dielectric layer 112 is BST that has been cured in a temperature range from about 650° C. to about 850° C.

In an embodiment, the first metal bottom electrode 112 is nickel. In an embodiment, the first metal bottom electrode 112 is copper. Other metals can be used for the first metal bottom electrode 112 according to a specific application.

Processing to form the various structures depicted in the TFC assembly 100 can include a physical vapor deposition (PVD) process to sputter metal to form the etch-stop layer 114 upon the stiffener 116. In an embodiment, the etch-stop layer 114 is a second metal. Accordingly in an embodiment, the etch-stop layer 114 is a second metal etch-stop layer 114. In an embodiment the second metal etch-stop layer 114 is platinum that is sputtered to a thickness in a range from about 0.1 µm to about 0.5 µm. In an embodiment, the second metal etch-stop layer 114 is platinum that is about 0.2 µm thick.

Figure 1B:
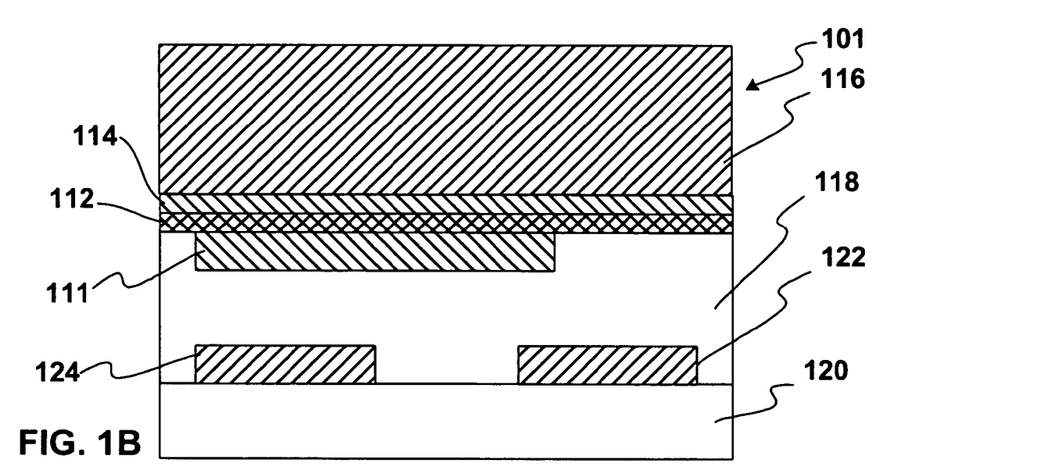
FIG. 1B is a cross-section elevation of the TFC assembly depicted in FIG. 1A after further processing according to an embodiment.

FIG. 1B is a cross-section elevation of the TFC assembly 100 depicted in FIG. 1A after further processing according to an embodiment. In FIG. 1B, the TFC assembly 101 has been laminated to a substrate dielectric 118 and to a mounting substrate 120 such as a core. The mounting substrate 120 includes the preparation for the TFC assembly 101, with a top electrode landing pad 122 and a bottom-electrode landing pad 124 according to an embodiment.

In an embodiment, the first metal bottom electrode layer 110, depicted in FIG. 1A, has been patterned to form a patterned first metal bottom electrode 111 before mating the TFC assembly 100 (FIG. 1A) to the substrate dielectric 118. Patterning of the first metal bottom electrode 111 can be done by patterning a mask upon the first metal bottom electrode layer 110 and etching according to known technique.

Figure 1C:
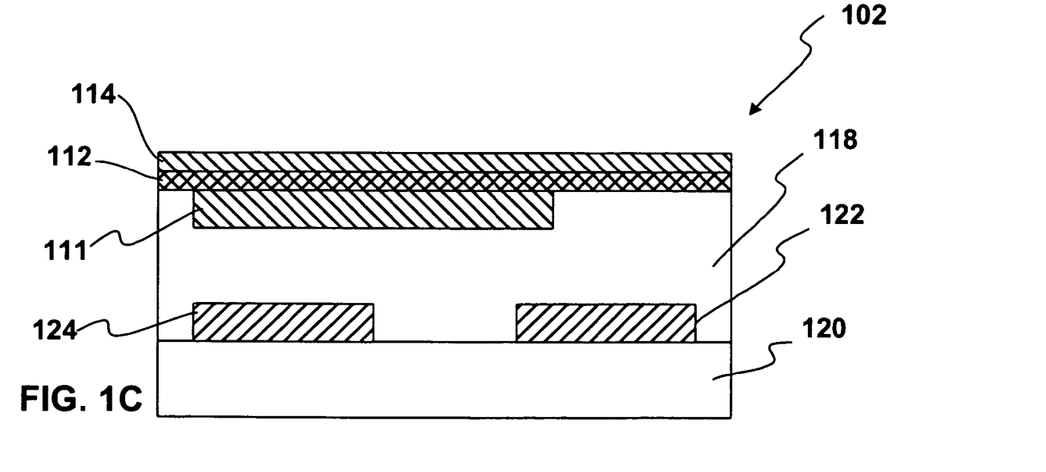
FIG. 1C is a cross-section elevation of the TFC assembly depicted in FIG. 1B after further processing according to an embodiment.

FIG. 1C is a cross-section elevation of the TFC assembly 101 depicted in FIG. 1B after further processing according to an embodiment. In FIG. 1C, the TFC assembly 102 has been etch-processed to remove the stiffener 116 (FIG. 1B). In an embodiment, the second metal etch-stop layer 114 is a metal that responds to a given etch recipe for removing the stiffener 116, e.g., a nickel or copper stiffener, with a greater etch selectivity to the second metal etch-stop layer 114 than the stiffener 116. A useful etch recipe to remove, e.g., nickel or copper but to leave, e.g., platinum is a respective nickel or copper acid etch according to known techniques. In an embodiment, the stiffener 116 is nickel and the second metal etch-stop layer 114 is platinum. In an embodiment, the stiffener 116 is copper and the second metal etch-stop layer 114 is platinum. The stiffener 116 in this embodiment, is removed by a wet nickel etch recipe that is selective to the platinum of the second metal etch-stop layer 114. Such etch recipes are conventional. In an embodiment, the stiffener 116 is a less-noble metal than the second metal etch-stop layer 114. In an embodiment, the second metal etch-stop layer is a metal other than platinum, but it has an etch-selectivity response for a given etch recipe that is more resistant to the etch recipe than the stiffener 116.

Figure 1D:
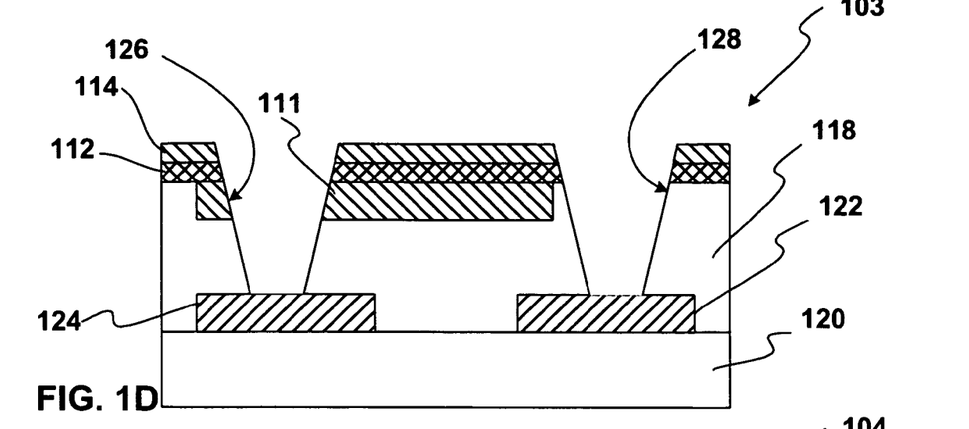
FIG. 1D is a cross-section elevation of the TFC assembly depicted in FIG. 1C after further processing according to an embodiment.

FIG. 1D is a cross-section elevation of the TFC assembly 102 depicted in FIG. 1C after further processing according to an embodiment. In FIG. 1D, the TFC assembly 103 has been processed such as by laser drilling, to form a bottom-electrode via 126 and a top electrode via 128. As depicted, the bottom-electrode via 126 has been formed through the dielectric layer 112 and has stopped upon the bottom-electrode landing pad 124. Similarly, the top electrode via 128 has been formed through the dielectric layer 112 and has stopped upon the top-electrode landing pad 122.

Figure 1E:
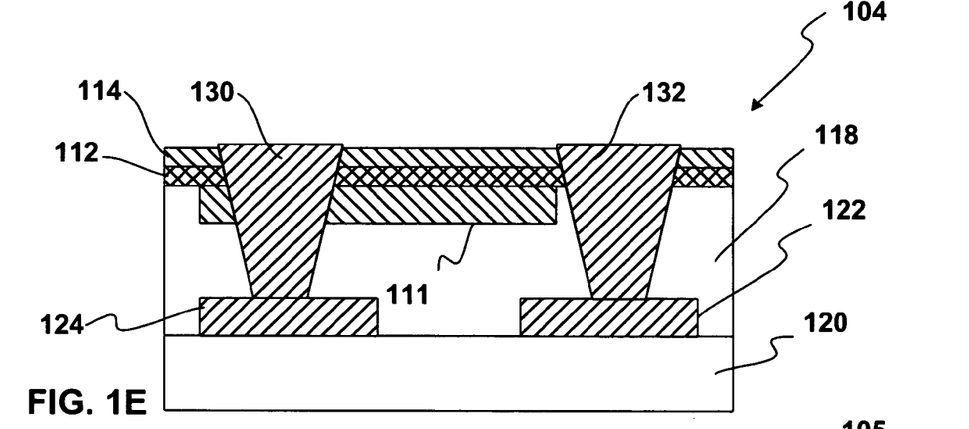
FIG. 1E is a cross-section elevation of the TFC assembly depicted in FIG. 1D after further processing according to an embodiment.

FIG. 1E is a cross-section elevation of the TFC assembly 130 depicted in FIG. 1D after further processing according to an embodiment. In FIG. 1E, the TFC assembly 104 includes a bottom-electrode contact 130 and a top-electrode contact 132. In an embodiment, the bottom-electrode contact 130 and the top-electrode contact 132 are formed by electrodeposition of a metal that uses the landing pads 122 and 124 as cathodes.

Figure 1F:
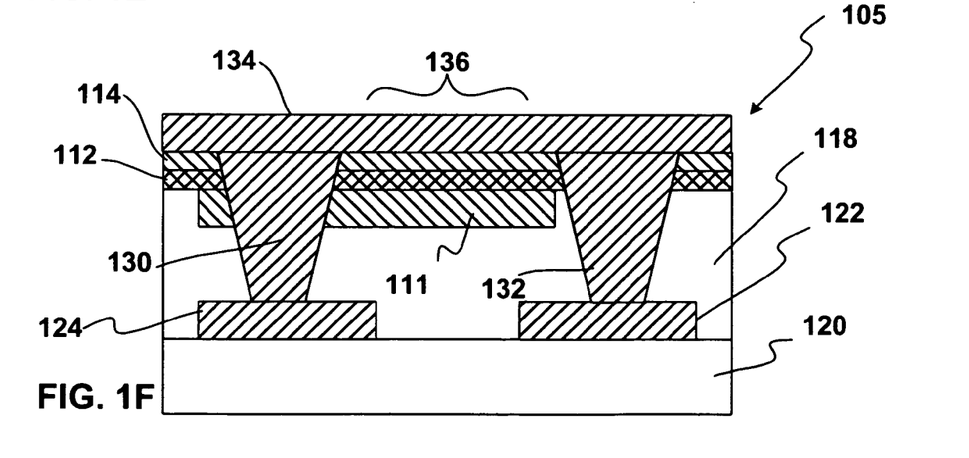
FIG. 1F is a cross-section elevation of the TFC assembly depicted in FIG. 1E after further processing according to an embodiment.

FIG. 1F is a cross-section elevation of the TFC assembly 104 depicted in FIG. 1E or in FIG. 1D after further processing according to an embodiment. In FIG. 1F, the TFC assembly 105 includes a third metal top-electrode layer 134 that has been formed over the second metal etch-stop layer 114. In an embodiment, formation of both the subsequent metal top electrode layer 134 and the contacts 122 and 124 is carried out in a single deposition process, such that the three structures 122, 124, and 134 are substantially integral as a unitary piece of metal. Further processing of the subsequent metal top electrode layer 134 can include a half-etch to achieve a significant thickness in the subsequent metal top electrode layer 134 for a useful structure with respect to the thickness of the first metal bottom electrode 111 and the thickness of the dielectric layer 112 and the second metal etch-stop layer 114.

As depicted in FIG. 1F, the TFC assembly 105 includes an area, approximated by the bracket 136, that represents the lateral surface dimension of capacitor plates for a thin-film capacitor. In an embodiment, the thickness of the first metal bottom electrode 111 is about 5 µm of copper, the dielectric layer 112 is about 1 µm of cured BST ceramic, the second metal etch-stop layer 114 is about 0.2 µm of platinum, and the subsequent metal top electrode layer 134 is about 5 µm of copper.

Figure 1G:
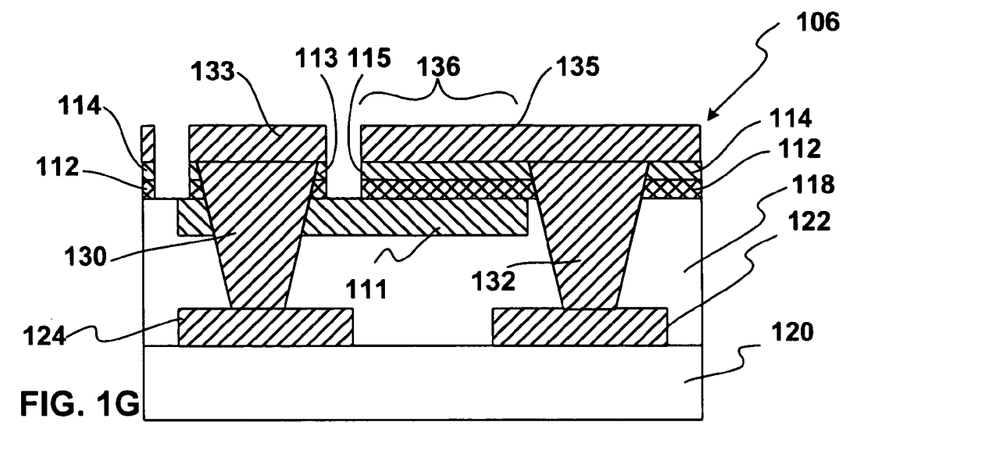
FIG. 1G is a cross-section elevation of the TFC assembly depicted in FIG. 1F after further processing according to an embodiment.

FIG. 1G is a cross-section elevation of the TFC assembly 105 depicted in FIG. 1F after further processing according to an embodiment. In FIG. 1G, the TFC assembly 106 has been processed to isolate the first metal bottom electrode 111 (FIG. 1G) from the subsequent metal top electrode layer 134 (FIG. 1F). Such processing has included forming the subsequent metal top electrode 135 by masking the subsequent metal top electrode layer 134 (FIG. 1F) and etching, which process leaves an extension 133 of the bottom contact 130 as formerly part of the subsequent metal top electrode layer 134. FIG. 1G also illustrates a subsequent metal top electrode portion 115 of the second metal etch-stop layer 114 as well as a bottom-electrode portion 113 of the second metal etch-stop layer 114. A high-k ceramic film 112 of a TFC does not need to be etched away to isolate the electrodes 111 and 135.

Figure 1H:
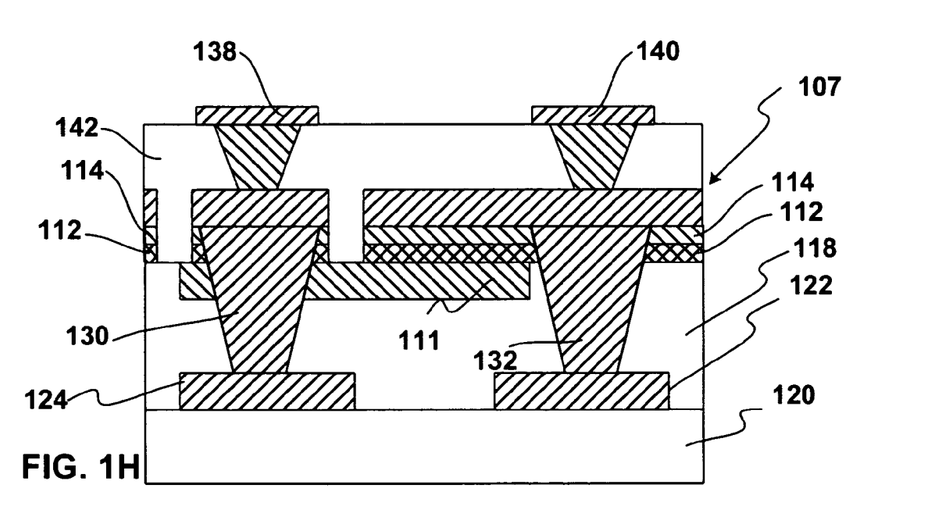
FIG. 1H is a cross-section elevation of the TFC assembly depicted in FIG. 1G after further processing according to an embodiment.

FIG. 1H is a cross-section elevation of the TFC assembly 106 depicted in FIG. 1G after further processing according to an embodiment. In FIG. 1H, the TFC assembly 107 has been further processed to include pin-out bond pads 138 and 140. An upper dielectric layer 142 is formed over the extension 133 of the bottom contact 130 and the subsequent metal top electrode 135. The pin-out bond pads 138 and 140 are coupled to the respective bottom contact 130 and top contact 132 through the upper dielectric layer 142. In an embodiment, the metal of the pin-out bond pads 138 and 140 is the same metal as that of the subsequent metal top electrode 135.

Figure 2:
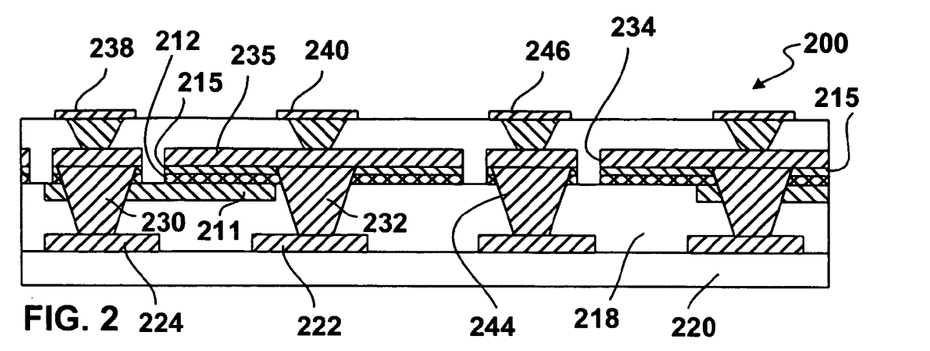
FIG. 2 is a cross-section elevation of a TFC assembly that includes a pass-through contact according to an embodiment.

FIG. 2 is a cross-section elevation of a TFC assembly 200 that includes a pass-through contact 244 according to an embodiment. In an embodiment, the TFC assembly 200 includes a substrate dielectric 218 disposed on a mounting substrate 220. The TFC assembly 200 includes, among other structures, a first metal bottom electrode 211, a subsequent metal top electrode 235 from the subsequent metal top electrode layer 134, and a second metal portion 215 of a second metal etch-stop layer 214. A ceramic dielectric layer 212 is disposed between the subsequent metal top electrode 235 and the first metal bottom electrode 211.

Formation of the pass-through contact 244 can be done simultaneously with formation of a bottom electrode contact 230 and a top electrode contact 232. Accordingly the first metal bottom electrode 211 is isolated from the second metal portion 215 of the second metal etch-stop layer 214 at the same time as isolation of the pass-though contact 244 is accomplished. Connection of the first metal bottom electrode 211 and the subsequent metal top electrode 235, as well as the pass-through contact 244 is made by pin-out bond pads 238, 240, and 246, respectively.

Figure 3:
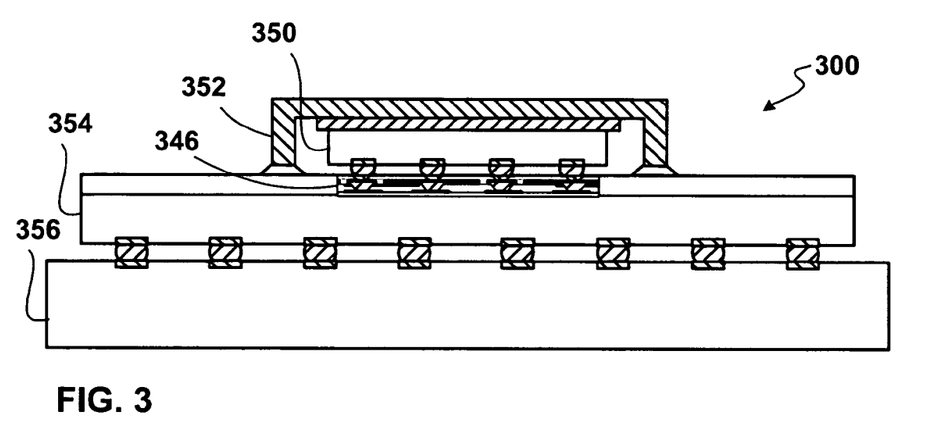
FIG. 3 is a cross-section elevation of a flip-chip package that includes a TFC assembly according to an embodiment.

FIG. 3 is a cross-section elevation of a flip-chip package 300 that includes a TFC assembly 346 according to an embodiment. The flip-chip package 300 includes a die 350 and a heat sink 352 that is an integrated heat spreader according to an embodiment. The TFC assembly 346 can be any construction of a TFC assembly and its equivalents, set forth in this disclosure. Details of the TFC assembly 346 are presented only schematically. In an embodiment, the TFC assembly 346 includes a first metal bottom electrode, a second metal etch-stop layer, a ceramic dielectric, a subsequent metal top electrode, and a pass-through contact as set forth in this disclosure according to any embodiment.

In an embodiment, the TFC assembly 346 is laminated to a second-level structure 354 such as an interposer according to an embodiment. Similarly, the second-level structure 354 is disposed on a board 356 that can be a third-level structure such as a motherboard according to an embodiment.

Figure 4:
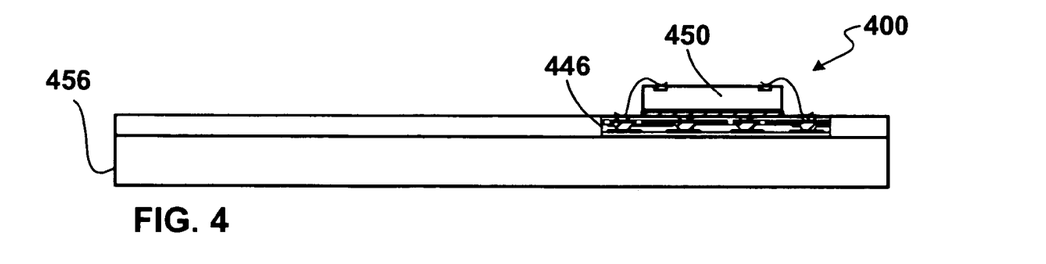
FIG. 4 is a cross-section elevation of a wire-bond chip package that includes a TFC assembly according to an embodiment.

FIG. 4 is a cross-section elevation of a wire-bond chip package 400 that includes a TFC assembly according to an embodiment. The wire-bond chip package 400 includes a die 450 that is disposed above a TFC assembly 446 according to an embodiment. The TFC assembly 446 can be any construction of a TFC assembly and its equivalents, set forth in this disclosure. Details of the TFC assembly 446 are presented only schematically. In an embodiment, the TFC assembly 446 includes a first metal bottom electrode, a second metal etch-stop layer, a ceramic dielectric layer, a subsequent metal top electrode, and a pass-through contact as set forth in this disclosure according to any embodiment. In an embodiment, the TFC assembly 446 includes a first metal bottom electrode, a second metal etch-stop layer, a dielectric layer, a subsequent metal top electrode, and a pass-through contact as set forth according to any embodiment in this disclosure.

In an embodiment, the TFC assembly 446 is laminated to a board 456 that can be a motherboard according to an embodiment. Where the TFC assembly 446 is packaged in connection with a die 452 that part of a wireless device or a hand-held device, the board 456 is the bottom substrate according to an embodiment. In an embodiment, the board 456 is an outer structure to a hand-held device such as the shell of a mobile telephone.

Figure 5:
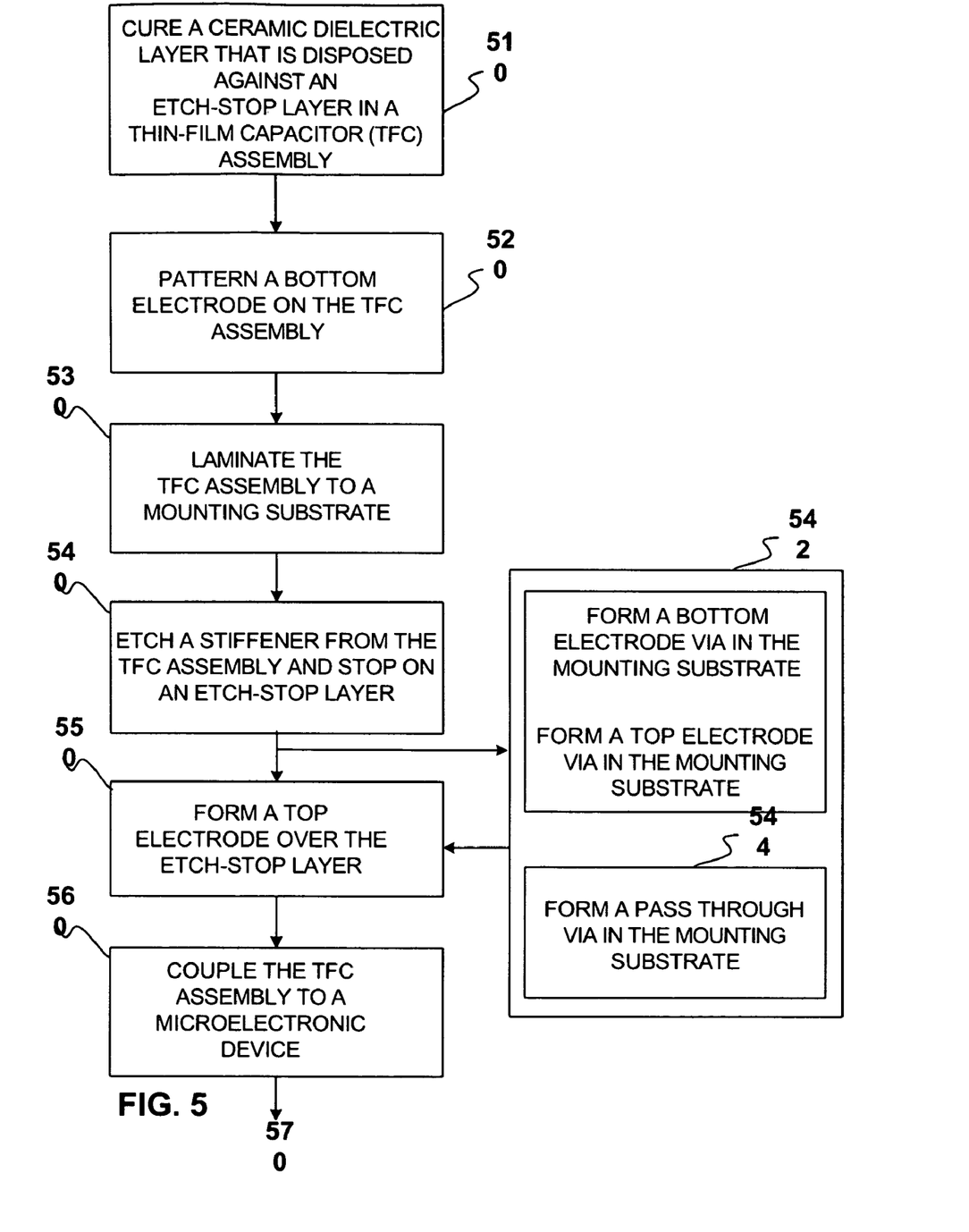
FIG. 5 is a flow chart 500 that describes process flow embodiments.

FIG. 5 is a flow chart 500 that describes process flow embodiments. At 510 a process includes curing a ceramic dielectric layer that is part of a TFC assembly. In an embodiment, the ceramic dielectric layer is a BST green ceramic that is thermally cured. In an embodiment, the dielectric layer is disposed below and on the etch-stop layer. In an embodiment, the process commences and terminates at 510.

At 520, the process includes patterning a bottom electrode on the TFC assembly. In an embodiment, a first metal bottom electrode layer is patterned by a masked etch.

At 530, the process includes laminating the TFC assembly to a mounting substrate. In an embodiment, the mounting substrate includes a substrate dielectric that insulates the first metal bottom electrode from the mounting substrate. In an embodiment, the process commences and terminates at 530.

At 540 the process includes etching a stiffener that is part of a TFC assembly. In an embodiment, the etching process includes removing all the stiffener by a wet etch that stops on the etch-stop layer At 542, the process includes forming a bottom electrode via and a top electrode via in the mounting substrate. Optionally at 544, the process includes forming a pass-through via in the mounting substrate. "Mounting substrate" in this embodiment, means that the vias are formed such that electrical coupling can be accomplished between the mounting substrate and the TFC assembly. Accordingly as illustrated in FIG. 1D, the vias 126 and 128 are formed in the substrate dielectric 118, which is part of the mounting substrate assembly of items 118 and 120.

At 550, the process includes forming a top electrode over the etch-stop layer. In an embodiment, the process includes forming a subsequent metal top electrode layer over a second metal etch-stop layer, followed by patterning the subsequent metal top electrode layer into a subsequent metal top electrode. In an embodiment, the process commences at 520 and terminates at 550. In an embodiment, the process commences at 510 and terminates at 550.

At 560, the process includes coupling the TFC assembly to a microelectronic device. In an embodiment, the process includes coupling the subsequent metal top electrode to a die such as the die 350 to the TFC assembly 346. Additionally according to an embodiment, the process includes coupling the microelectronic device to a heat sink. In an illustrative embodiment, the process includes bonding the die 352 to the integrated heat spreader 352. In an embodiment, the process commences and terminates at 560. In an embodiment, the process commences at 520 and terminates at 560. In an embodiment, the process commences at 510 and terminates at 560. In an embodiment, the process commences at 560 and terminates at 570.

Figure 6:
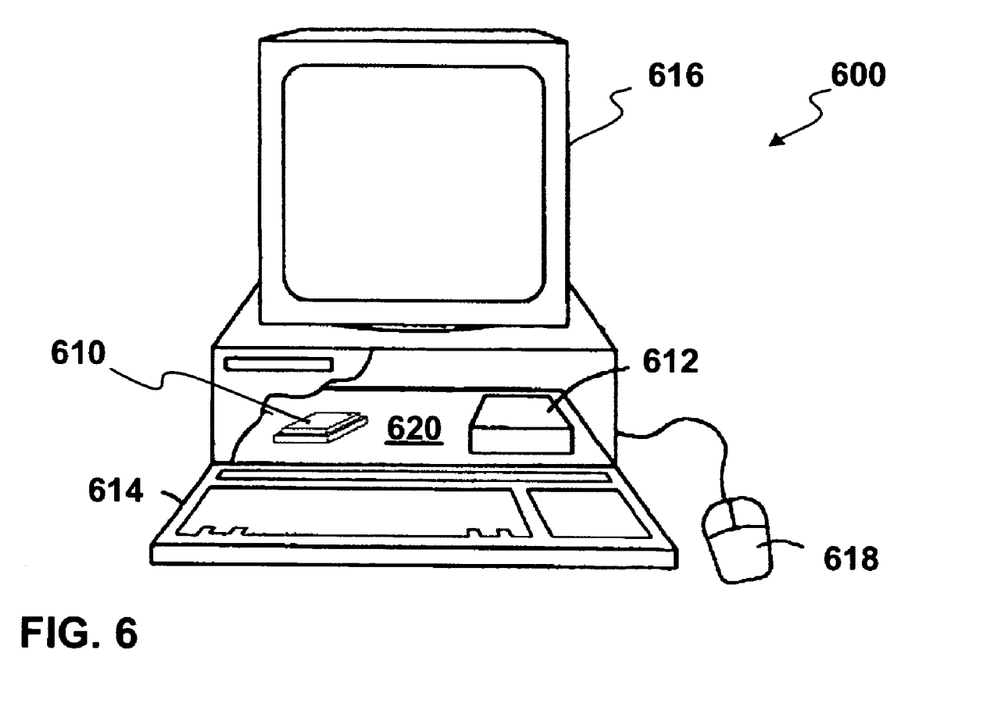
FIG. 6 is a cut-away elevation that depicts a computing system according to an embodiment.

FIG. 6 is a cut-away elevation that depicts a computing system according to an embodiment. One or more of the foregoing embodiments of the TFC assembly embodiments may be utilized in a computing system, such as a computing system 600 of FIG. 6. Hereinafter any TFC assembly embodiment alone or in combination with any other embodiment is referred to as an embodiment(s) configuration.

The computing system 600 includes at least one processor (not pictured), which is enclosed in a package 610, a data storage system 612, at least one input device such as a keyboard 614, and at least one output device such as a monitor 616, for example. The computing system 600 includes a processor that processes data signals, and may include, for example, a microprocessor, available from Intel Corporation. In addition to the keyboard 614, the computing system 600 can include another user input device such as a mouse 618, for example. The computing system 600 can include a structure, after processing as depicted in FIG. 3, including the die 350, the TFC assembly 346, and the integrated heat spreader 352. Similarly, the computing system 600 can include a structure, after processing as depicted in FIG. 4, including the wire-bond die 450 and the TFC assembly 446.

For purposes of this disclosure, a computing system 600 embodying components in accordance with the claimed subject matter may include any system that utilizes a microelectronic device system, which may include, for example, at least one of the TFC assembly embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 612.

In an embodiment, the computing system 600 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 620. In this embodiment, an embodiment(s) configuration is coupled to the DSP, and a separate embodiment(s) configuration may be present that is coupled to the processor in the package 610. Additionally in an embodiment, an embodiment(s) configuration is coupled to a DSP that is mounted on the same board 620 as the package 610. It can now be appreciated that the embodiment(s) configuration can be combined as set forth with respect to the computing system 600, in combination with an embodiment(s) configuration as set forth by the various embodiments of the TFC assembly within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   etching a stiffener of a thin-film capacitor (TFC) assembly wherein the stiffener is selected from tin and copper, the TFC assembly including:
   a bottom electrode of a first metal;
   a dielectric layer disposed above and on the bottom electrode;
   an etch-stop layer of a second metal disposed above and on the dielectric layer, wherein the etch-stop layer is metallic; and
   the stiffener; and
   wherein etching includes an etch recipe that is selective to the etch-stop layer, and the process further including curing the TFC assembly at a temperature range from about 650° C. to about 850° C.

2. The process of claim 1, wherein etching includes wet etching the stiffener.

3. The process of claim 1, the process further including:
   patterning the bottom electrode;
   laminating the TFC assembly at the bottom electrode to a mounting substrate;
   forming a bottom electrode via into the mounting substrate and through the dielectric layer; and
   forming a top electrode above the etch-stop layer.

4. The process of claim 1, the process further including:
   patterning the bottom electrode;
   laminating the TFC assembly at the bottom electrode to a mounting substrate;
   forming a bottom electrode via into the mounting substrate and through the dielectric layer;
   forming a top electrode via into the mounting substrate and through the dielectric layer; and
   forming a subsequent metal top electrode above the etch-stop layer.

5. The process of claim 4, further including:
   forming an upper dielectric layer above the subsequent metal top electrode; and
   forming a pin-out bond pad on the upper dielectric layer that is coupled to the subsequent metal top electrode.

6. The process of claim 1, the process further including:
   patterning the bottom electrode;
   attaching the TFC assembly at the bottom electrode to a mounting substrate;
   forming a bottom electrode via into the mounting substrate and through the dielectric layer;
   forming a top electrode via into the mounting substrate and through the dielectric layer;
   forming a subsequent metal top electrode above the etch-stop layer; and
   forming a pass-through contact through the TFC assembly.

7. The process of claim 1, the process further including:
   patterning the bottom electrode;
   laminating the TFC assembly at the bottom electrode to a mounting substrate; and
   coupling the TFC assembly to a die.

8. The process of claim 1, the process further including:
   patterning the bottom electrode;
   laminating the TFC assembly at the bottom electrode to a mounting substrate;
   forming an upper dielectric layer above the subsequent metal top electrode; and
   forming a pin-out bond pad on the upper dielectric layer that is coupled to the subsequent metal top electrode; and
   coupling the TFC assembly to a die.

9. The process of claim 1, the process further including:
patterning the bottom electrode;
laminating the TFC assembly at the bottom electrode to a mounting substrate;
coupling the TFC assembly to a die; and
coupling the die to a heat sink.

10. The process of claim 1, the process further including:
patterning the bottom electrode;
laminating the TFC assembly at the bottom electrode to a mounting substrate;
coupling the TFC assembly to a die;
wire-bonding the die to a board.

11. The process of claim 1, the process further including:
coupling the TFC assembly to a die;
wire-bonding the die to a board.

12. A process comprising:
etching a stiffener of a thin-film capacitor (TFC) assembly wherein the stiffener is selected from tin and copper, the TFC assembly including:
a bottom electrode of a first metal;
a dielectric layer disposed above and on the bottom electrode;
an etch-stop layer of a second metal disposed above and on the dielectric layers,
wherein the etch-stop layer is metallic; and
the stiffener;
wherein etching includes an etch recipe that is selective to the etch-stop layer, and wherein etching includes wet etching the stiffener;
patterning the bottom electrode;
laminating the TFC assembly at the bottom electrode to a mounting substrate;
forming a bottom electrode via into the mounting substrate and through the dielectric layer;
forming a top electrode via into the mounting substrate and through the dielectric layer;
forming a subsequent metal top electrode above the etch-stop layer; and
curing the TFC assembly at a temperature range from about 650° C. to about 850° C.

13. The process of claim 12, further including:
coupling the TFC assembly to a die; and
coupling the die to a heat sink.

14. The process of claim 12, further including:
forming an upper dielectric layer above the subsequent metal top electrode; and
forming a pin-out bond pad on the upper dielectric layer that is coupled to the subsequent metal top electrode.

15. A process comprising:
curing a thin-film capacitor (TFC) assembly at a temperature range from about 650° C. to about 850° C., the TFC assembly including:
a bottom electrode of a first metal;
a dielectric layer disposed above and on the bottom electrode;
an etch-stop layer of a second metal disposed above and on the dielectric layer; and
a stiffener, wherein the stiffener is selected from tin and copper; the process further including
etching the stiffener, wherein etching includes wet etching the stiffener, and wherein etching includes an etch recipe that is selective to the etch-stop layer;
patterning the bottom electrode;
laminating the TFC assembly at the bottom electrode to a mounting substrate;
forming a bottom electrode via into the mounting substrate and through the dielectric layer; and
forming a top electrode above the etch-stop layer.

16. The process of claim 15, further including:
forming an upper dielectric layer above the top electrode; and
forming a pin-out bond pad on the upper dielectric layer that is coupled to the subsequent metal top electrode.

17. The process of claim 15, the process further including forming a pass-through contact through the TFC assembly.

18. The process of claim 15, the process further including:
coupling the TFC assembly to a die; and
coupling the die to a heat sink.

19. The process of claim 15, the process further including:
coupling the TFC assembly to a die;
coupling the die to a heat sink; and wire-bonding the die to a board.

20. A process comprising:
etching a stiffener of a thin-film capacitor (TFC) assembly wherein the stiffener is selected from tin and copper, the TFC assembly including:
a bottom electrode of a first metal;
a dielectric layer disposed above and on the bottom electrode;
an etch-stop layer of a second metal disposed above and on the dielectric layer,
wherein the etch-stop layer is metallic; and
the stiffener;
wherein etching includes an etch recipe that is selective to the etch-stop layer, and wherein etching includes wet etching the stiffener;
patterning the bottom electrode;
laminating the TFC assembly at the bottom electrode to a mounting substrate;
forming a bottom electrode via into the mounting substrate and through the dielectric layer;
forming a top electrode via into the mounting substrate and through the dielectric layer;
forming a subsequent metal top electrode above the etch-stop layer;
forming an upper dielectric layer above the subsequent metal top electrode; and
curing the TFC assembly at a temperature range from about 650° C. to about 850° C.

* * * * *

UNITED STATES PATENT AND TRADEMARK OFFICE
CERTIFICATE OF CORRECTION

PATENT NO. : 7,588,992 B2  Page 1 of 1
APPLICATION NO. : 11/152328
DATED : September 15, 2009
INVENTOR(S) : Yongki Min It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 808 days.

Signed and Sealed this

Twenty-first Day of September, 2010

David J. Kappos
*Director of the United States Patent and Trademark Office*